US011356862B2

(12) United States Patent
Furuta et al.

(10) Patent No.: US 11,356,862 B2
(45) Date of Patent: Jun. 7, 2022

(54) MEASURING METHOD AND MEASURING DEVICE

(71) Applicant: NTT DOCOMO, INC., Tokyo (JP)

(72) Inventors: Takayuki Furuta, Tokyo (JP); Seiji Hagiwara, Tokyo (JP)

(73) Assignee: NTT DOCOMO, INC., Tokyo (JP)

( * ) Notice: Subject to any disclaimer, the term of this patent is extended or adjusted under 35 U.S.C. 154(b) by 29 days.

(21) Appl. No.: 17/055,896

(22) PCT Filed: May 21, 2019

(86) PCT No.: PCT/JP2019/020152
§ 371 (c)(1),
(2) Date: Nov. 16, 2020

(87) PCT Pub. No.: WO2019/225617
PCT Pub. Date: Nov. 28, 2019

(65) Prior Publication Data
US 2021/0227399 A1    Jul. 22, 2021

(30) Foreign Application Priority Data
May 22, 2018 (JP) .............................. JP2018-098269

(51) Int. Cl.
*H04W 16/28* (2009.01)
*H04B 17/318* (2015.01)
(Continued)

(52) U.S. Cl.
CPC .......... *H04W 16/28* (2013.01); *H04B 7/0617* (2013.01); *H04B 17/318* (2015.01); *H04W 24/10* (2013.01)

(58) Field of Classification Search
CPC ..... H04W 16/28; H04W 24/10; H04W 24/06; H04W 64/006; H04W 4/026; H04W 8/005; H04B 7/0617; H04B 17/318; H04B 17/102; H04B 7/088; H04B 7/0695; H04B 7/0602; H04B 7/0619; G01R 29/08
See application file for complete search history.

(56) References Cited

U.S. PATENT DOCUMENTS

2015/0173038 A1* 6/2015 Quan ..................... H04W 64/00
455/456.5
2021/0105061 A1* 4/2021 Godala ................... H04B 7/088

OTHER PUBLICATIONS

International Search Report issued in PCT/JP2019/020152 dated Jul. 23, 2019 (4 pages).

(Continued)

*Primary Examiner* — Fred A Casca
(74) *Attorney, Agent, or Firm* — Osha Bergman Watanabe & Burton LLP

(57) ABSTRACT

A measuring method executes an identifying procedure of measuring signal power of a beam from user equipment supporting beam-formed transmission, identifying a measurement antenna that detects a peak of the beam transmitted from the user equipment; a calculating procedure of calculating a first angle formed between a straight line connecting the measurement antenna detecting the peak of the beam transmitted from the user equipment to the user equipment and a straight line connecting a measurement antenna located in a direction of an azimuth angle rotation axis of the user equipment to the user equipment; and a rotating procedure of rotating the user equipment based on the first angle.

6 Claims, 8 Drawing Sheets

(51) Int. Cl.
    *H04B 7/06*         (2006.01)
    *H04W 24/10*     (2009.01)

(56)           References Cited

OTHER PUBLICATIONS

Written Opinion of the International Searching Authority issued in PCT/JP2019/020152 dated Jul. 23, 2019 (6 pages).
3GPP TS 38.211 V15.1.0, "3rd Generation Partnership Project; Technical Specification Group Radio Access Network NR; Physical channels and modulation (Release 15)"; Mar. 2018 (90 pages).
3GPP TR 38.810 V2.1.0, "3rd Generation Partnership Project; Technical Specification Group Radio Access Network; Study on test methods for New Radio (Release 15)"; Apr. 2018 (74 pages).

* cited by examiner

DIGITAL BEAM FORMING

ANALOG BEAM FORMING

Phase shifters

HYBRID BEAM FORMING

ROTATED DUT

MEASURING METHOD AND MEASURING DEVICE

TECHNICAL FIELD

The present invention relates to a measurement method and a measurement device in a radio communication system.

BACKGROUND ART

In 3GPP (3rd Generation Partnership Project) a radio communication scheme called 5G or NR (the radio communication scheme is referred to as "5G" or "NR," hereinafter) has been studied in order to further increase the capacity of the system, further increase the data transmission rate, and further reduce the latency in the radio section. In 5G, various radio technologies have been studied in order to meet the requirement that the latency of the radio section is reduced to be less than or equal to 1 ms, while achieving the throughput of greater than or equal to 10 Gbps.

In 5G, radio communication using millimeter waves has been studied, and a wide range of frequencies up to a higher frequency band than that of LTE (Long Term Evolution) is expected to be used. In particular, since the propagation loss increases in the high frequency band, application of beam forming with a narrow beam width has been studied to compensate for the propagation loss (e.g., Non-Patent Document 1). In addition, a method for measuring transmission power of a beam has been studied (e.g., Non-Patent Document 2).

PRIOR ART DOCUMENT

Non-Patent Document

Non-Patent Document 1: 3GPP TS 38.211 V15.1.0 (2018 March)
Non-Patent Document 2: 3GPP TR 38.810 V2.1.0 (2018 April)

SUMMARY OF THE INVENTION

Problem to be Solved by the Invention

In the current study of the 5G system, transmission power is specified to be measured in all directions when user equipment executes transmission while using beam forming. However, depending on a peak direction of a beam, correct measurement may be unable to be performed when the user equipment is rotated to perform a measurement in all directions.

The present invention has been developed in view of the above-described point, and an object is to perform measurement in a peak direction of a beam from user equipment that supports beam-formed transmission.

Means for Solving the Problem

According to the disclosed technique, there is provided a measuring method for measuring signal power of a beam from user equipment supporting beam-formed transmission, wherein the measuring method executes an identifying procedure of identifying a measurement antenna that detects a peak of the beam transmitted from the user equipment; a calculating procedure of calculating a first angle formed between a straight line connecting the measurement antenna to the user equipment, the measurement antenna detecting the peak of the beam transmitted from the user equipment, and a straight line connecting a measurement antenna located in a direction of an azimuth angle rotation axis of the user equipment to the user equipment; and a rotation procedure of rotating the user equipment based on the first angle.

Advantage of the Invention

According to the disclosed technique, a measurement can be executed in a peak direction of a beam from user equipment that supports beam-formed transmission.

EMBODIMENTS OF THE INVENTION

Figure 1:
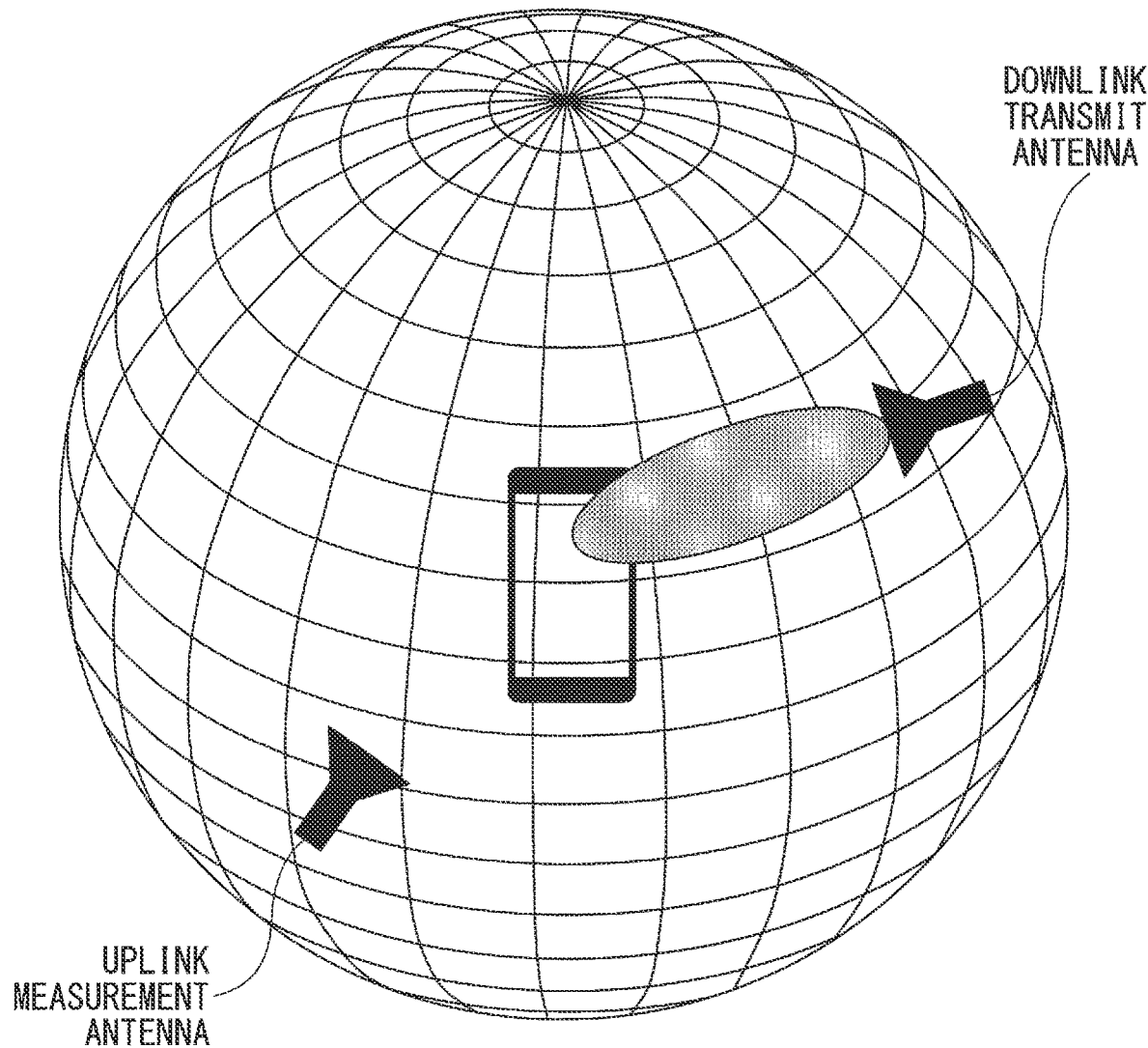
FIG. 1 is a diagram illustrating an example of a TRP measurement method.

In the following, embodiments of the present invention are described by referring to the drawings. Note that the embodiments described below are merely examples, and embodiments to which the present invention is applied are not limited to the following embodiments.

In operation of a radio communication system of the embodiment, existing technology may be used as appropriate. The existing technology is, for example, existing LTE. However, the existing technology is not limited to an existing LTE. Additionally, the term "LTE" used in this specification is intended to have a broad meaning that includes, unless otherwise stated, LTE Advanced and a scheme subsequent to LTE-Advanced (e.g., 5G, or NR).

In the embodiments described below, the terms SS (Synchronization Signal), PSS (Primary SS), SSS (Secondary SS), and PBCH (Physical Broadcast channel) used in existing LTEs are used for convenience of description, and similar signals, functions, etc., may be referred to by other names. Additionally, the above-described terms in NR are denoted as NR-SS, NR-PSS, NR-SSS, NR-PBCH, etc.

In this embodiment, a duplex method may be a TDD (Time Division Duplex) method or an FDD (Frequency Division Duplex) method. Additionally, in the following description, transmitting a signal using a transmit beam may be synonymous with transmitting a signal to which the precoding vector is multiplied (precoded with a precoding vector). Similarly, receiving a signal using a reception beam may be synonymous with multiplying the received signal by a predetermined weight vector. Transmitting a signal using a transmit beam may also be expressed as transmitting the signal with a particular antenna port. Similarly, receiving a signal using a reception beam may be expressed as receiving the signal with a specific antenna port. An antenna port is a logical antenna port defined in the 3GPP standard.

Note that the method of forming transmit and reception beams is not limited to the above-described method. For example, in a base station apparatus and user equipment provided with multiple antennas, a method of varying an angle of each antenna may be used; a method may be used in which a method of using a preceding vector and a method of varying an angle of an antenna are combined; or any other method may be used. Furthermore, for example, a plurality of mutually different transmit beams may be used in a high frequency band. Use of multiple transmit beams is referred to as a multi-beam operation, and use of a single transmit beam is referred to as a single beam operation.

FIG. 1 is a diagram illustrating an example of a TRP measurement method. As shown in FIG. 1, TRP (Total Radiated Power) is obtained by measuring in all the directions of a sphere centered on a DUT (device under test), which is user equipment. The frequency band to be measured is assumed to be FR2 (frequency range 2) of NR. A link is formed by transmitting, from a downlink transmit antenna, a signal transmitted from a base station, and transmission power of signals radiated in all the directions from the DUT is measured by an uplink measurement antenna. The transmission power of the DUT is defined using two indices: EIRP (Equivalent Isotropic Radiated Power) or TRP. EIRP is an index indicating power emitted from an antenna, and TRP is a total (integrated value) of power in all the directions of 360 degrees. For example, by defining maximum transmit power using EIRP and TRP, a signal can be transmitted from an antenna with maximum transmission power specified in EIRP that exceeds maximum transmission power specified in TRP in a direction of a beam.

<Example of Beam Forming>

Figure 2:
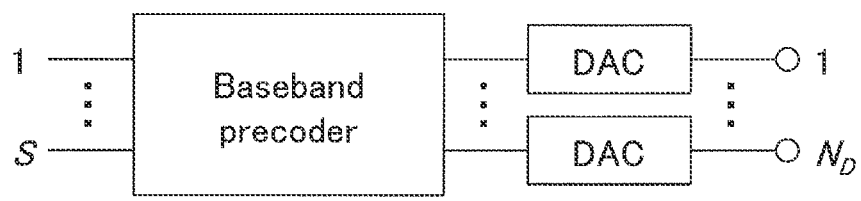
FIG. 2 is a diagram illustrating an example of a configuration of a circuit for performing digital beam forming.

FIG. 2 is a diagram illustrating an example of a configuration of a circuit for performing digital beam forming. As a method for implementing beam forming, as shown in FIG. 2, digital beam forming has been studied in which a number of DACs (Digital Analog Converters) equal to a number of transmit antenna elements is provided and baseband signal processing for performing precoding is executed a number of times equal to the number of transmit antenna elements.

Figure 3:
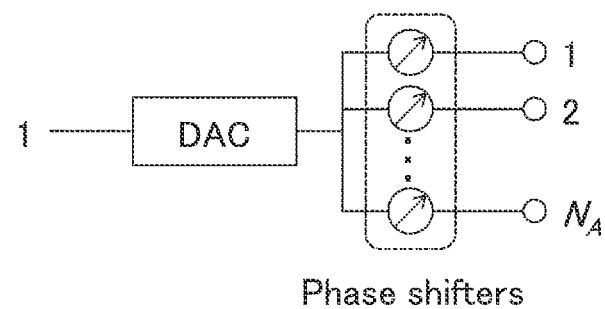
FIG. 3 is a diagram illustrating an example of a configuration of a circuit for performing analog beam forming.

FIG. 3 is a diagram illustrating an example of a configuration of a circuit for performing analog beam forming. As a method for implementing analog beam forming, as shown in FIG. 3, analog beam forming has been studied in which a transmission signal is converted into an analog signal through a DAC, and, subsequently, beam forming is implemented using variable phase shifters in an RF (Radio Frequency) circuit.

Figure 4:
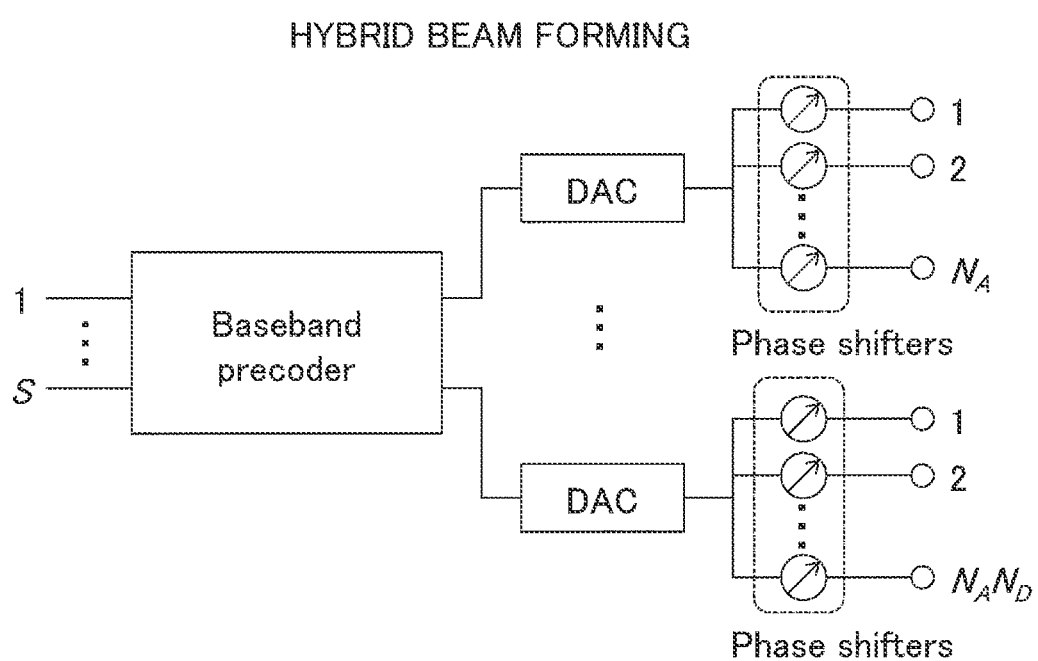
FIG. 4 is a diagram illustrating an example of a configuration of a circuit for performing hybrid beam forming.

FIG. 4 is a diagram illustrating an example of a configuration of a circuit for performing digital beam forming. As illustrated in FIG. 4, hybrid beam forming has been studied in which beam forming processing is implemented by both baseband signal processing for precoding and variable phase shifters in an RF (Radio Frequency) circuit by combining digital beam forming and analog beam forming.

Figure 5:
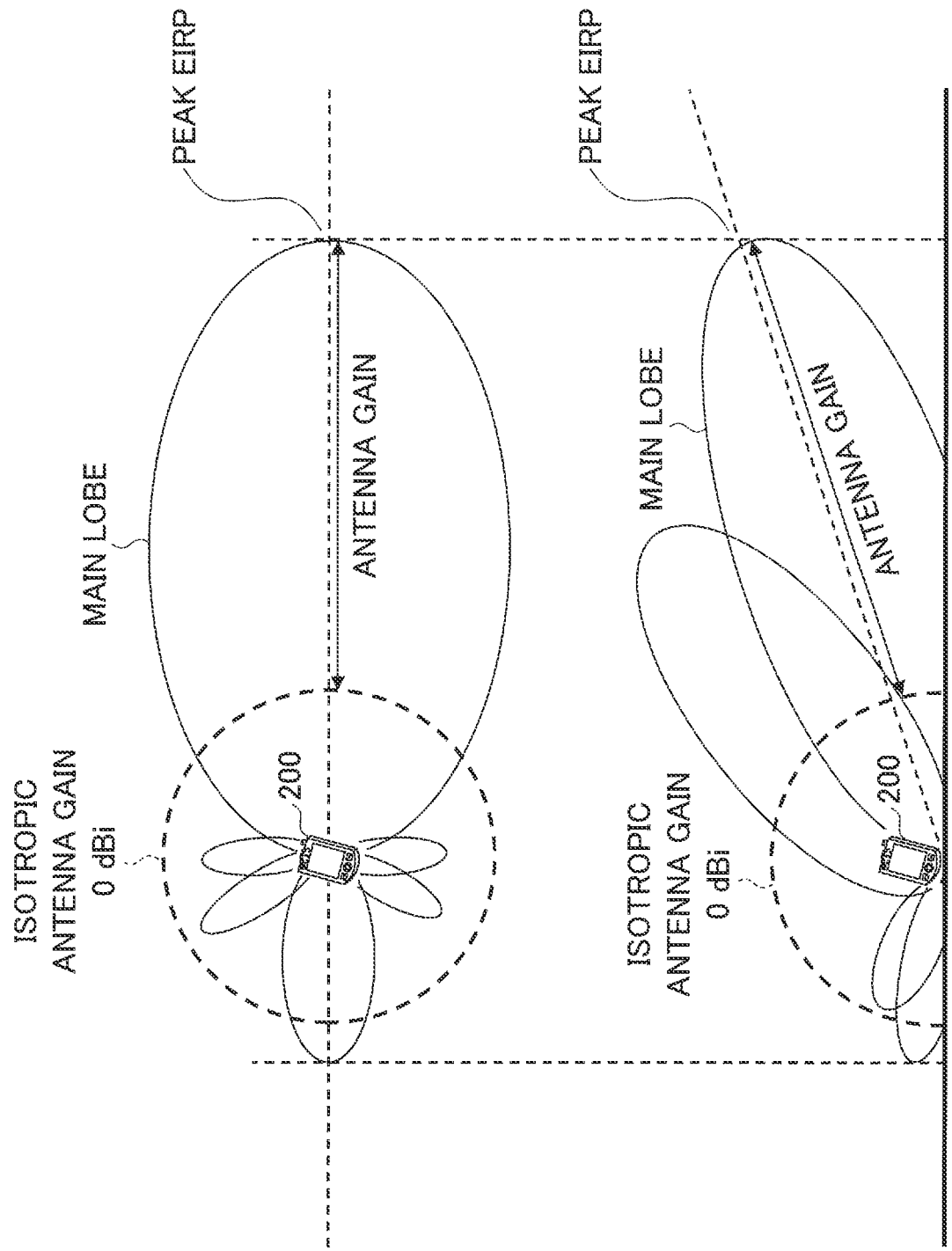
FIG. 5 is a diagram illustrating a peak EIRP of transmit power.

FIG. 5 is a diagram illustrating a peak EIRP of transmit power. In the upper illustration of FIG. 5, antenna characteristics of the user equipment in a horizontal plane are schematically illustrated.

As illustrated in FIG. 5, maximum radiation of a main lobe of an antenna of the user equipment corresponds to peak EIRP (Equivalent Isotropic Radiated Power). That is, the peak EIRP can be achieved in a direction in which the antenna of the user device can obtain the maximum antenna gain. At this time, a distance from the dotted line indicated by the isotropic antenna gain of 0 dBi to the dotted line representing the peak EIRP corresponds to the antenna gain. For example, when the transmit power is 20 dBm at an end of an antenna connector and the peak EIRP is 30 dBm, antenna gain at a time of achieving the peak EIRP is 10 dB. At a time of not achieving the peak EIRP by the user equipment, i.e., when the user equipment is not performing transmission toward a bore site of the antenna, the antenna gain is reduced to 7 dB, for example.

Additionally, in the lower illustration of FIG. 5, antenna characteristics of the user equipment in a vertical plane are schematically illustrated. Maximum radiation of a main lobe of an antenna of the user equipment corresponds to the peak EIRP. Accordingly, the peak EIRP can be achieved in a direction in which the antenna of the user device can obtain the maximum antenna gain. At this time, a distance from the dotted line indicated by the isotropic antenna pain of 0 dBi to the dotted line representing the peak EIRP corresponds to the antenna gain.

Figure 6:
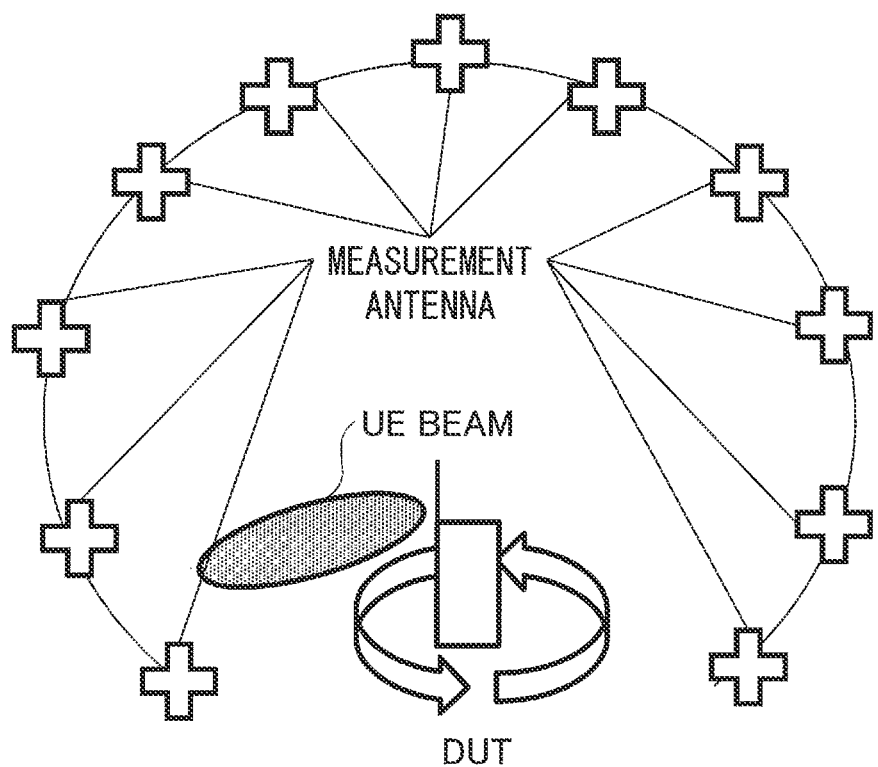
FIG. 6 is a diagram (1) illustrating an example of a measuring method according to an embodiment of the present invention.

FIG. 6 is a diagram (1) illustrating an example of a measuring method according to an embodiment of the present invention. A measurement method based on NFTF (Near field to far field transform) has been studied for millimeter wave measurements in 5G. EIRP or TRP measurements can be made based on NFTF. NFTF has the following features.

1) A beam pattern of user equipment is measured in a near field. Based on the beam pattern, a mathematical transformation to a far field is performed. Final metrics, such as EIRP, are calculated.

2) With respect to a measurement antenna and a link antenna, which are double polarization antennas, a DUT is positioned with at least two axial degrees of freedom.

3) An LTE link antenna is used, and a stable downlink is provided by LTE signals. The measurement antenna is an antenna that measures an uplink signal, and the link antenna is an antenna that transmits a downlink signal. The measurement antenna may be separated from the link antenna, or the same antenna may be used.

Additionally, a beam lock function (UBF: UE beam lock function) that does not change a setting of a beam is specified during TRP measurement. The beam lock secures a strongest beam i.e., secures a beam at a peak. Prior to the beam lock, a peak search is performed to detect a peak of a beam.

In NFTF, multiple measurement antennas are placed around the DUT to measure signal power in all directions of the DUT. The measurement antennas shown in FIG. 6 are installed in a vertical plane with respect to the DUT. In FIG. 6, a peak search has already been performed and a peak direction of a beam from the DUT may be included in the vertical plane with respect to the DUT around which the measurement antennas are installed.

Since a peak direction of a beam from a DUT differs depending on an implementation of a terminal, a peak direction is not determined. Thus, if a peak direction of a UE beam is as shown in FIG. 6, rotation of the DUT on the horizontal plane may cause the peak direction of the beam not to be in the directions of the measurement antennas during a TRP measurement.

Thus, after the DUT is rotated so that the peak direction of the beam is in the direction of the measurement antenna installed at the top relative to the DUT in FIG. 6, the DUT is rotated on the horizontal plane.

Figure 7:
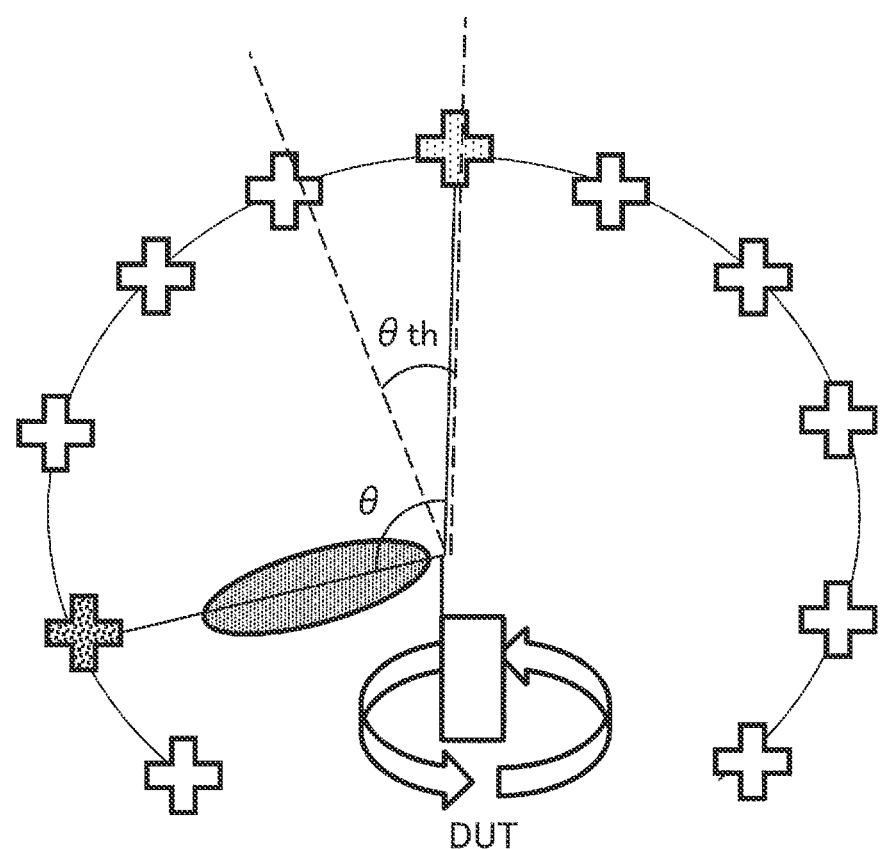
FIG. 7 is a diagram (2) illustrating the example of the measurement method according to the embodiment of the present invention.

FIG. 7 is a diagram (2) illustrating the example of the measurement method according to the embodiment of the present invention. The measuring device 100 calculates an angle θ formed between a straight line connecting a measurement antenna that detects a peak of a beam illustrated in FIG. 7 to the DUT and a straight line connecting the measurement antenna installed at the top to the DUT. The angle θ may be an elevation-only angle and may not include an azimuth angle. Note that the angle θ may be input to the measuring device 100 from outside.

The DUT is then rotated according to the angle θ so that the peak direction of the beam approaches the measurement antenna installed on the top. The measuring device 100 in the embodiment of the present invention is provided with a mechanism that rotates the DUT according to the angle θ so that the peak direction of the beam approaches the measurement antenna installed on the top. The rotation of the DUT according to the angle θ may be performed on an axis perpendicular to the plane on which the measuring antennas are installed.

Here, when the angle θ is within a predetermined threshold value θth, the DUT need not be rotated. For example, as shown in FIG. 7, an angle to the measurement antenna adjacent to the measurement antenna installed on the top may be set to a threshold value θth.

Figure 8:
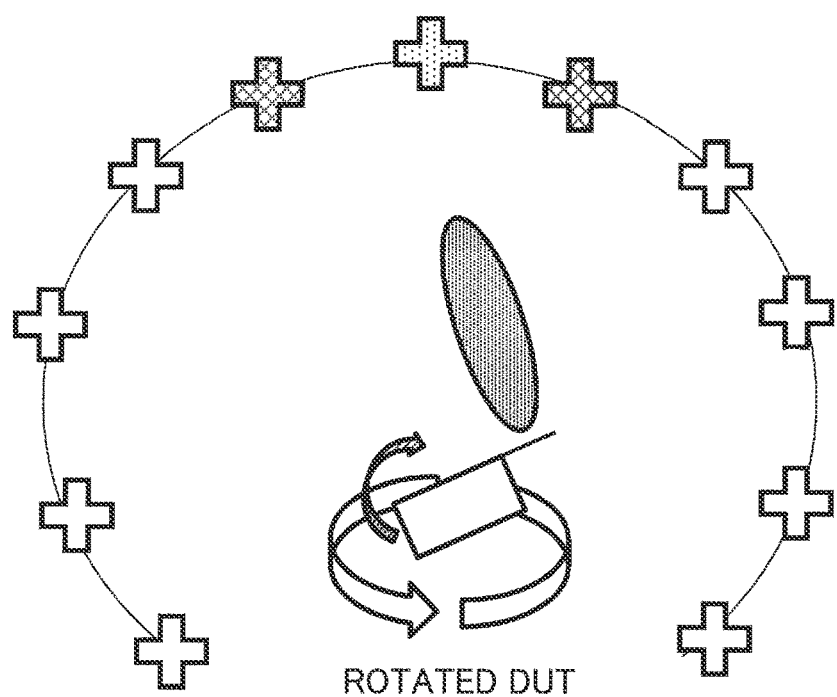
FIG. 8 is a diagram (3) illustrating the example of the measurement method according to the embodiment of the present invention.

FIG. 8 is a diagram (3) illustrating the example of the measurement method according to the embodiment of the present invention. As shown in FIG. 8, the DUT is rotated according to the angle θ between the measurement antenna that detects the peak of the beam and the measurement antenna placed on the top, and then the DUT is rotated in the azimuth direction to measure the TRP.

If the peak direction of the beam is directed toward the top, the measuring device 100 can maintain a state in which the peak of the beam from the DUT is directed toward the measurement antenna, even if the DUT is rotated in the azimuth direction. Furthermore, if the peak direction of the beam is directed to a range of an elevation angle of a predetermined threshold θth from the top, even if the DUT is rotated in the azimuth direction, the measuring device 100 may maintain a state in which the peak of the beam from the DUT is directed toward the measurement antenna.

Note that the top means the rotation axis direction when the DUT is rotated in the azimuth direction to measure TRP after rotation by angle θ is performed. For example, if the azimuth angle is not an angle of rotation with respect to an axis perpendicular to the horizontal plane, the measurement antenna need not be located at the top of the DUT.

By the above-described embodiment, the measuring device 100 can cause the peak direction of the beam to be directed toward the measurement antenna installed on the top, by rotating the DUT based on the angle between the measurement antenna that detects the peak of the beam and the measurement antenna installed on the top. Furthermore, by rotating the DUT in the azimuth direction in the state in which the DUT is rotated so that the peak direction of the beam is directed toward the measurement antenna installed on the top, the measuring device 100 can perform measurement while maintaining a state in which the peak of the beam is directed toward the measurement antenna.

Namely, measurement can be performed in the peak direction of the beam from the user equipment that supports beam-formed transmission.

(Device Configuration)

Next, an example of a functional configuration of the measuring device 100 is described that executes the process and operation described above. The measuring device 100 includes a function for implementing the above-described embodiments. However, each measuring device 100 may include only a part of the functions of the embodiments.

<Measuring Device 100>

Figure 9:
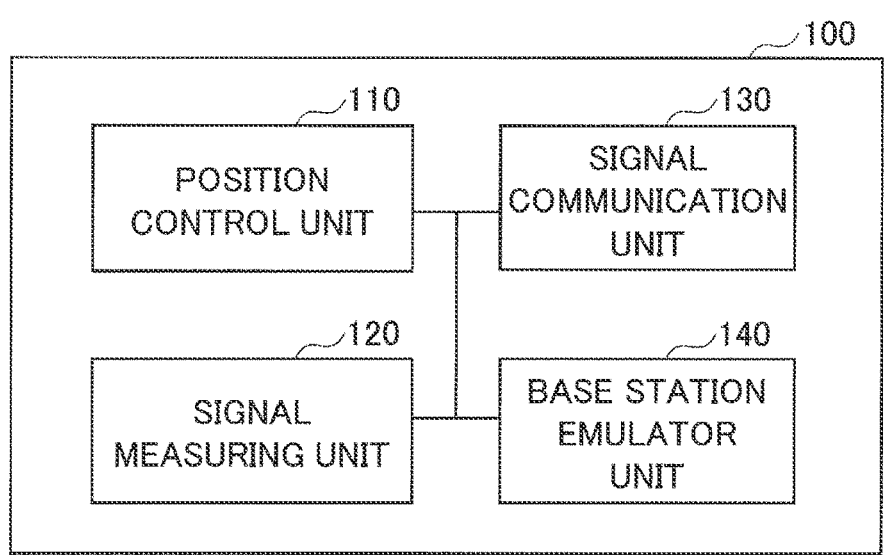
FIG. 9 is a diagram illustrating an example of a functional configuration of a measuring device 100 according to an embodiment of the present invention.

FIG. 9 is a diagram illustrating an example of a functional configuration of the measuring device 100. As shown in FIG. 9, the measuring device 100 includes a position control unit 110; a signal measuring unit 120; a signal communication unit 130; and a base station emulator unit 140. The functional division and names of functional units may be any division and names, provided that the operation according to the embodiment of the present invention can be executed.

The position control unit 110 includes a function for controlling the position of the DUT. The position control unit 110 drives a stepping motor or any other actuator included in the measuring device 100 to position the DUT at a location with desired azimuth angle and elevation angle.

The signal measuring unit 120 can measure the power of the signal transmitted from the DUT received by the signal communication unit 130, execute the measurement based on the NFTF, and calculate the EIRP or TRP. The signal communication unit 130 transmits radio signals to and receives radio signals from the DUT. The base station emulator unit 140 is provided with a function of a base station that generates a control signal or data, etc., of radio communication with the DUT through the signal communication unit 130, which is required for maintaining a link for performing measurement.

Each functional unit of the above-described measuring device 100 may be formed of a plurality of devices or may be formed of one device. For example, the measuring device 100 may be formed of a plurality of devices in which the base station emulator unit 140 is a separate device.

(Hardware Configuration)

The functional configuration diagram (FIG. 9) used to illustrate the above-described embodiments of the present invention illustrates blocks based on functional units. These functional blocks (components) are implemented by any combination of hardware and/or software. Furthermore, the means for implementing each functional block is not particularly limited. That is, each functional block may be implemented by one device in which a plurality of elements is physically and/or logically connected, or may be implemented by two or more devices that are physically and/or logically separated while connecting the two or more devices directly and/or indirectly (e.g., wired and/or wireless).

Figure 10:
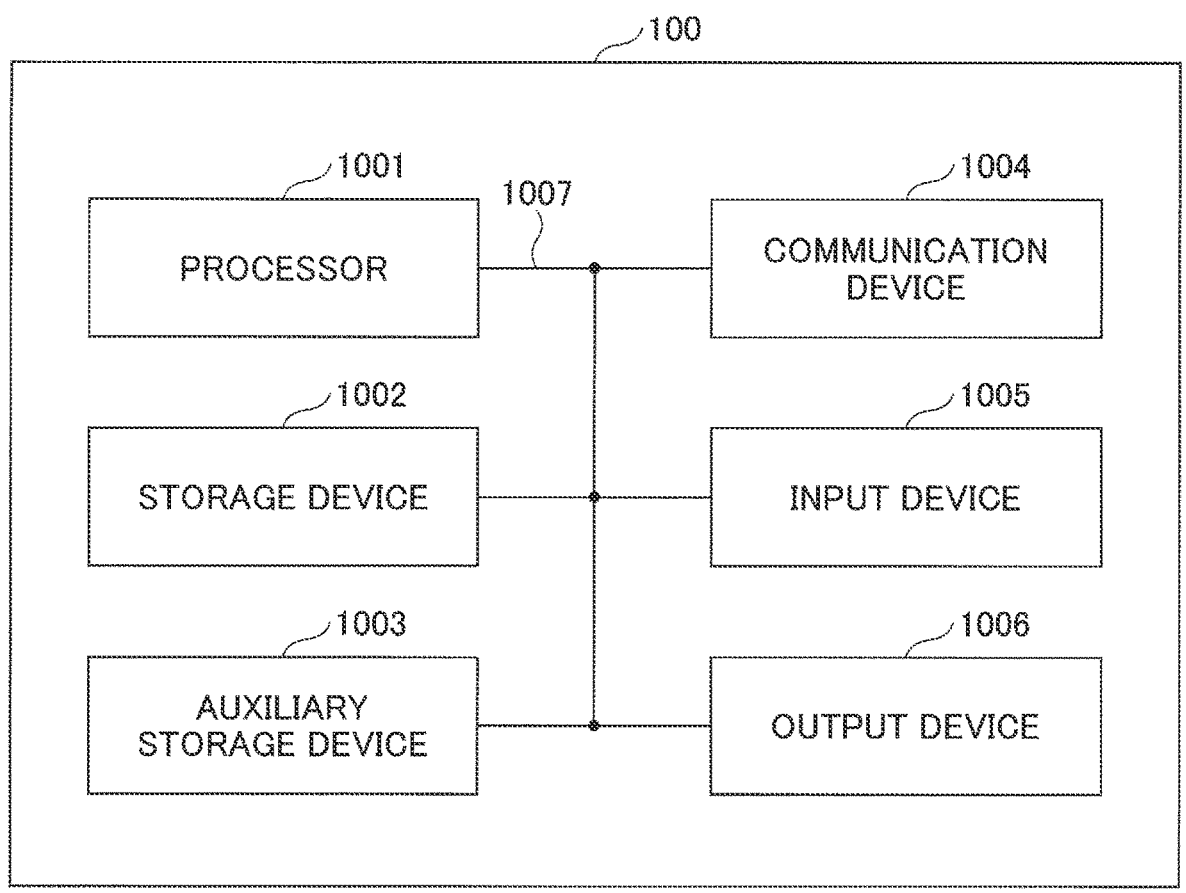
FIG. 10 is a diagram illustrating an example of a hardware configuration of the measuring device 100 according to the embodiment of the present invention.

FIG. 10 is a diagram illustrating an example of a hardware configuration of the measuring device 100 according to an embodiment of the present invention. For example, the measuring device 100 in an embodiment of the present invention may function as a computer for performing processes according to the embodiments of the present invention. The measuring device 100 described above may be physically configured as a computer device including a processor 1001, a storage device 1002, an auxiliary storage device 1003, a communication device 1004, an input device 1005, an output device 1006, a bus 1007, etc.

In the following description, the term "device" can be read as a circuit, device, unit, etc. The hardware configuration of the measuring device 100 may be configured to include one or more of the devices illustrated in FIGS. 1001-1006, or may be configured without some devices.

Each function in the measuring device 100 is implemented by causing predetermined software (a program) to be read onto hardware, such as the processor 1001 and the storage device 1002, so that the processor 1001 performs an operation so as to control the communication by the communication device 1004 and reading and/or writing of data in the storage device 1002 and the auxiliary storage device 1003.

The processor 1001, for example, operates an operating system to control the entire computer. The processor 1001 may be formed of a central processing unit (CPU) including interfaces with peripheral devices, control devices, processing devices, registers, etc.

The processor 1001 also reads programs (program codes), software modules or data from the auxiliary storage device 1003 and/or the communication device 1004 into the storage device 1002 and performs various processes in accordance with these. As a program, a program that causes a computer to execute at least a part of the operation described in the above-described embodiment is used. For example, the position control unit 110, the signal measuring unit 120, the signal communication unit 130, and the base station emulator unit 140 of the measuring device 100 illustrated in FIG. 9 may be implemented by a control program that is stored in the storage device 1002 and that is operated by the processor 1001. The above-described various processes are described to be executed by a single processor 1001. However, the above-described various processes may be simultaneously or sequentially executed by two or more processors 1001. The processor 1001 may be implemented by one or more chips. Note that the program may be transmitted from a network via a telecommunication line.

The storage device 1002 is a computer readable storage medium and may be formed of, for example, at least one of ROM (Read Only Memory), EPROM (Erasable Programmable ROM), EEPROM (Electrically Erasable Programmable ROM), RAM (Random Access Memory) etc. The storage device 1002 may be referred to as a register, cache, main memory (main storage device), etc. The storage device 1002 may store programs (program codes), software modules, etc., executable to perform the process according to the embodiment of the present invention.

The auxiliary storage device 1003 is a computer readable storage medium and may be formed of, for example, at least one of an optical disk, such as a CD-ROM (Compact Disc ROM), a hard disk drive, a flexible disk, an optical magnetic disk (e.g., a compact disk, a digital versatile disk, a Blu-ray (registered trademark) disk), a smart card, a flash memory (e.g., a card, a stick, a key drive), a floppy (registered trademark) disk, a magnetic strip, etc. The storage medium described above may be, for example, a database, a server, or any other suitable medium including the storage device 1002 and/or the auxiliary storage device 1003.

The communication device 1004 is hardware (transmission/reception device) for performing communication between computers via a wired and/or wireless network, and, for example, the communication device 1004 is also referred to as a network device, a network controller, a network card, a communication module, etc. For example, the signal communication unit 130 of the measuring device 100 may be implemented by the communication device 1004.

The input device 1005 is an input device (e.g., a keyboard, a mouse, a microphone, a switch, a button, a sensor, etc.) for receiving an input from outside. The output device 1006 is an output device (e.g., display, speaker, LED lamp, etc.) that performs output toward outside. Note that the input device 1005 and the output device 1006 may be integrated (for example, a touch panel).

Furthermore, the devices, such as the processor 1001 and the storage device 1002, are connected by a bus 1007 for communicating information. The bus 1007 may be formed of a single bus, or the bus 1007 may be formed of buses that are different among the devices.

Furthermore, the measuring device 100 may be configured to include hardware, such as a microprocessor, a digital signal processor (DSP: Digital Signal Processor), an ASIC (Application Specific Integrated Circuit), a PLD (Programmable Logic Device), an FPGA (Field Programmable Gate Array), etc., and a part or all of the functional blocks may be implemented by the hardware. For example, the processor 1001 may be implemented with at least one of these hardware components. The measuring device is provided.

By the above-described configuration, the measuring device 100 can perform measurement in a peak direction of a beam from user equipment that supports beam-formed transmission.

The information may include one or more pairs of associated total radiated power and equivalent isotropic radiated power per band. Such construction may be made.

(Conclusion of the Embodiments)

As described above, according to the embodiments of the present invention, there is provided a measuring method for measuring signal power of a beam from user equipment supporting beam-formed transmission, wherein the measuring method executes an identifying procedure of identifying a measurement antenna that detects a peak of the beam transmitted from the user equipment; a calculating procedure of calculating a first angle formed between a straight line connecting the measurement antenna detecting the peak of the beam transmitted from the user equipment to the user equipment and a straight line connecting a measurement antenna located in a direction of an azimuth angle rotation axis of the user equipment to the user equipment; and a rotating procedure of rotating the user equipment based on the first angle.

With the above-described configuration, by rotating the DUT based on an angle between the measurement antenna that detects the peak of the beam and the measurement antenna installed on the top, the measuring device 100 can cause the peak direction of the beam to be directed toward the measurement antenna installed on the top. Namely, measurement can be performed in the peak direction of the beam from the user equipment that supports beam-formed transmission.

A detecting procedure may further be included, which measures signal power of a beam by rotating, in the azimuth direction, the user equipment rotated based on the first angle by the rotating procedure. With this configuration, by rotating the DUT in the azimuth angle direction in a state in which the DUT is rotated such that the peak direction of the beam is directed toward the measurement antenna installed on the top, the measuring device 100 can execute measurement while maintaining the state in which the peak of the beam is directed toward the measurement antenna.

The first angle may be an elevation angle of the user equipment. With this configuration, by rotating the DUT based on the angle between the measurement antenna that detects the peak of the beam and the measurement antenna installed on the top, the measuring device 100 can cause the peak direction of the beam to be directed toward the measurement antenna installed on the top.

Upon detecting that the first angle is less than or equal to a second angle, the rotating procedure need not be executed. With this configuration, when an angle between the measurement antenna that detects the peak of the beam and the measurement antenna installed on the top is within a predetermined threshold value, the measuring device 100 can cause the peak direction of the beam to be directed toward the measurement antenna installed on the top, without rotating the DUT.

The second angle may be an angle formed between a straight line connecting the measurement antenna located in the direction of the azimuth angle rotation axis of the user equipment to the user equipment and a straight line connecting a measurement antenna located adjacent to the measurement antenna located in the direction of the azimuth angle rotation axis of the user equipment to the user equipment. With this configuration, when an angle between the measurement antenna located on the top and the measurement antenna located adjacent to it is within a predetermined threshold value, the measuring device 100 can cause the peak direction of the beam to be directed toward the measurement antenna installed on the top, without rotating the DUT.

Furthermore, according to the embodiments of the present invention, there is provided a measuring device for measuring signal power of a beam from user equipment supporting beam-formed transmission, wherein the measuring device includes an identifying unit that identifies a measurement antenna that detects a peak of the beam transmitted from the user equipment; a calculating unit that calculates a first angle formed between a straight line connecting the measurement antenna detecting the peak of the beam transmitted from the user equipment to the user equipment and a straight line connecting a measurement antenna located in a direction of an azimuth angle rotation axis of the user equipment to the user equipment; and a rotating unit that rotates the user equipment based on the first angle.

With the above-described configuration, by rotating the DUT based on an angle between the measurement antenna that detects the peak of the beam and the measurement antenna installed on the top, the measuring device 100 can cause the peak direction of the beam to be directed toward the measurement antenna installed on the top. Furthermore, by rotating the DUT in the azimuth angle direction in a state in which the DUT is rotated such that the peak direction of the beam is directed toward the measurement antenna installed on the top, the measuring device 100 can execute measurement while maintaining the state in which the peak of the beam is directed toward the measurement antenna. Namely, measurement can be performed in the peak direction of the beam from the user equipment that supports beam-formed transmission.

(Supplements of Embodiments)

The embodiments of the present invention are described above, but the disclosed invention is not limited to the above embodiments, and those skilled in the art would appreciate various modified examples, revised examples, alternative examples, substitution examples, and so forth. In order to facilitate understanding of the invention, specific numerical value examples are used for description, but the numerical values are merely examples, and certain suitable values may be used unless as otherwise stated. The classification of items in the above description is not essential to the present invention. Matters described in two or more items may be combined and used as necessary, and a matter described in one item may be applied to a matter described in another item (provided that they do not contradict). The boundary between functional units or processing units in a functional block diagram does not necessarily correspond to the boundary between physical parts. Operations of a plurality of functional units may be performed physically by one component, or an operation of one functional unit may be physically performed by a plurality of parts. In the procedures described in the embodiments, the order of the processes may be changed as long as there is no inconsistency. For the sake of convenience of processing description, the measuring device 100 is described using the functional block diagrams, but such devices may be implemented by hardware, software, or a combination thereof. Software executed by the processor included in the measuring device 100 according to the embodiments of the present invention may be stored in a random access memory (RAM), a flash memory, a read-only memory (ROM), an EPROM, an EEPROM, a register, a hard disk (HDD), a removable disk, a CD-ROM, a database, a server, or any other appropriate storage medium.

Each aspect/embodiment described in this specification can be applied to long term evolution (LTE), LTE-advanced (LTE-A), SUPER 3G IMT-Advanced, 4G, 5G, future radio access (FRA), W-CDMA (registered trademark), GSM: (registered trademark), CDMA2000, ultra mobile broadband (UMB), IEEE 802.11 (Wi-Fi) IEEE 802.16 (WiMAX), IEEE 802.20, ultra-wideband (UWB), Bluetooth (registered trademark), any other systems using an appropriate system and/or next generation systems extended based on these.

The processing procedures, sequences, flow charts, etc. of each aspect/embodiment described in this specification may be reordered, provided that there is no contradiction. For example, the methods described in the specification present elements of various steps in an exemplary order and are not limited to the particular order presented.

Each aspect/embodiment described in this specification may be used alone, may be used in combination, or may be used while being switched during the execution.

The user equipment may be referred to, by a person ordinarily skilled in the art, as a subscriber station, a mobile unit, a subscriber unit, a wireless unit, a remote unit, a mobile device, a wireless device, a wireless communication device, a remote device, a mobile subscriber stations, an access terminal, a mobile terminal, a wireless terminal, a remote terminal, a handset, a user agent, a mobile client, a client, or it may also be called by some other suitable terms.

A base station may be referred to by one of ordinary skill in the art as NB (NodeB), eNB (enhanced NodeB), gNB, base station, or some other suitable term.

The terms "determining" and "deciding" used in this specification may include various types of operations. For example, "determining" and "deciding" may include deeming that a result of calculating, computing, processing, deriving, investigating, looking up (e.g., search in a table, a database, or another data structure), or ascertaining is determined or decided. Furthermore, "determining" and "deciding" may include, for example, deeming that a result of receiving (e.g., reception of information), transmitting (e.g., transmission of information), input, output, or accessing (e.g., accessing data in memory) is determined or decided. Furthermore, "determining" and "deciding" may include deeming that a result of resolving, selecting, choosing, establishing, or comparing is determined or decided. Namely, "determining" and "deciding" may include deeming that some operation is determined or decided.

The expression "based on" used in the specification does not imply "based on only" unless otherwise stated particularly. In other words, the expression "based on" implies both "based on only" and "based on at least".

As long as the terms "include," "including," and variants thereof are used in the specification or in the claims, these terms are intended to be comprehensive, similar to the term "comprising." Furthermore, the term "or" used in the specification or the claims is intended not to be an exclusive OR.

In the entirety of the present disclosure, if an article is added by translation, such as, "a," "an," and "the" in English, these articles may include a plurality of things unless the context clearly indicates that they are not.

In the embodiment of the present invention, the position control unit 110 is an example of an identifying unit, a calculating unit, or a rotating unit. The signal measuring unit is an example of a detection unit. The angle θ is an example of a first angle. The threshold θth is an example of a second angle.

While the invention is described above in detail, it is apparent to those skilled in the art that the invention is not limited to the embodiments described the specification. The invention can be implemented as modifications and alterations without departing from the gist and scope of the invention as defined by the claims. Accordingly, the description herein is intended for illustrative purposes and does not have any limiting meaning to the present invention.

This international patent application is based on and claims priority to Japanese Patent Application No. 2018-098269 filed on May 22, 2018, and the entire content of Japanese Patent Application No. 2018-098269 is incorporated herein by reference.

LIST OF REFERENCE SYMBOLS

100 measuring device
110 position control unit
120 signal measuring unit
130 signal communication unit
140 base station emulator unit
1001 processor
1002 storage device
1003 auxiliary storage device
1004 communication device
1005 input device
1006 output device

The invention claimed is:

1. A measuring method for measuring signal power of a beam from user equipment supporting beam-formed transmission, wherein the measuring method executes:

an identifying procedure of identifying a measurement antenna that detects a peak of the beam transmitted from the user equipment;

a calculating procedure of calculating a first angle formed between a straight line connecting the measurement antenna detecting the peak of the beam transmitted from the user equipment to the user equipment and a straight line connecting a measurement antenna located in a direction of an azimuth angle rotation axis of the user equipment to the user equipment; and a rotating procedure of rotating the user equipment based on the first angle.

2. The measuring method according to claim 1, further comprising:

a detecting procedure of measuring signal power of a beam by rotating, in the azimuth direction, the user equipment rotated based on the first angle by the rotating procedure.

3. The measuring method according to claim 1, wherein the first angle is an elevation angle of the user equipment.

4. The measuring method according to claim 1, wherein, upon detecting that the first angle is less than or equal to a second angle, the rotating procedure is not executed.

5. The measuring method according to claim 4, wherein the second angle is an angle formed between a straight line connecting the measurement antenna located in the direction of the azimuth angle rotation axis of the user equipment to the user equipment and a straight line connecting a measurement antenna located adjacent to the measurement antenna located in the direction of the azimuth angle rotation axis of the user equipment to the user equipment.

6. A measuring device for measuring signal power of a beam from user equipment supporting beam-formed transmission, wherein the measuring device comprises:

an identifying unit that identifies a measurement antenna that detects a peak of the beam transmitted from the user equipment;

a calculating unit that calculates a first angle formed between a straight line connecting the measurement antenna detecting the peak of the beam transmitted from the user equipment to the user equipment and a straight line connecting a measurement antenna located in a direction of an azimuth angle rotation axis of the user equipment to the user equipment; and a rotating unit that rotates the user equipment based on the first angle.

* * * * *